(12) United States Patent
Tao et al.

(10) Patent No.: US 6,201,299 B1
(45) Date of Patent: Mar. 13, 2001

(54) SUBSTRATE STRUCTURE OF BGA SEMICONDUCTOR PACKAGE

(75) Inventors: Su Tao, Kaohsiung; Chih-Ming Chung, Kaohsiung Hsien; Jian-Cheng Chen, Tainan Hsien; Chun-Chi Lee, Kaohsiung, all of (TW)

(73) Assignee: Advanced Semiconductor Engineering, Inc., Kahsiung (TW)

( * ) Notice: Subject to any disclaimer, the term of this patent is extended or adjusted under 35 U.S.C. 154(b) by 0 days.

(21) Appl. No.: 09/339,035

(22) Filed: Jun. 23, 1999

(51) Int. Cl.[7] .................. H01L 23/053; H01L 23/12; H01L 23/15
(52) U.S. Cl. .................. 257/701; 257/684; 257/702; 257/723; 257/778; 257/782; 257/738; 257/780; 257/784; 257/787; 257/783; 438/125; 438/126
(58) Field of Search .................. 257/684, 668, 257/680, 778, 738, 701, 787, 723

(56) References Cited

U.S. PATENT DOCUMENTS 5,585,666 * 12/1996 Imamura .................. 257/668
5,614,760 * 3/1997 Osono et al. .................. 257/668
6,013,946 * 1/2000 Lee et al. .................. 257/684
6,048,755 * 4/2000 Jiang et al. .................. 438/118

* cited by examiner

Primary Examiner—Tom Thomas
Assistant Examiner—Nitin Parekh
(74) Attorney, Agent, or Firm—Bacon & Thomas; Richard E. Fichter

(57) ABSTRACT

A substrate structure mainly comprises a plurality of substrate units and a plurality of dispensing holes thereon. A main hole is provided on the surface of the substrate unit, the two ends of which are adjacent to the dispensing hole for dispensing liquified encapsulant material to form a semiconductor package. The semiconductor package mainly comprises a chip, a substrate and an encapsulant. The chip is adhesively attached to the substrate, and the encapsulant covers around the are along one side of the chip. Then the encapsulant flows from the upper surface of the substrate to the lower surface to cover wire areas by means of the liquified encapsulant material flowing through the dispensing hole from the upper surface of the substrate to the lower surface.

8 Claims, 4 Drawing Sheets

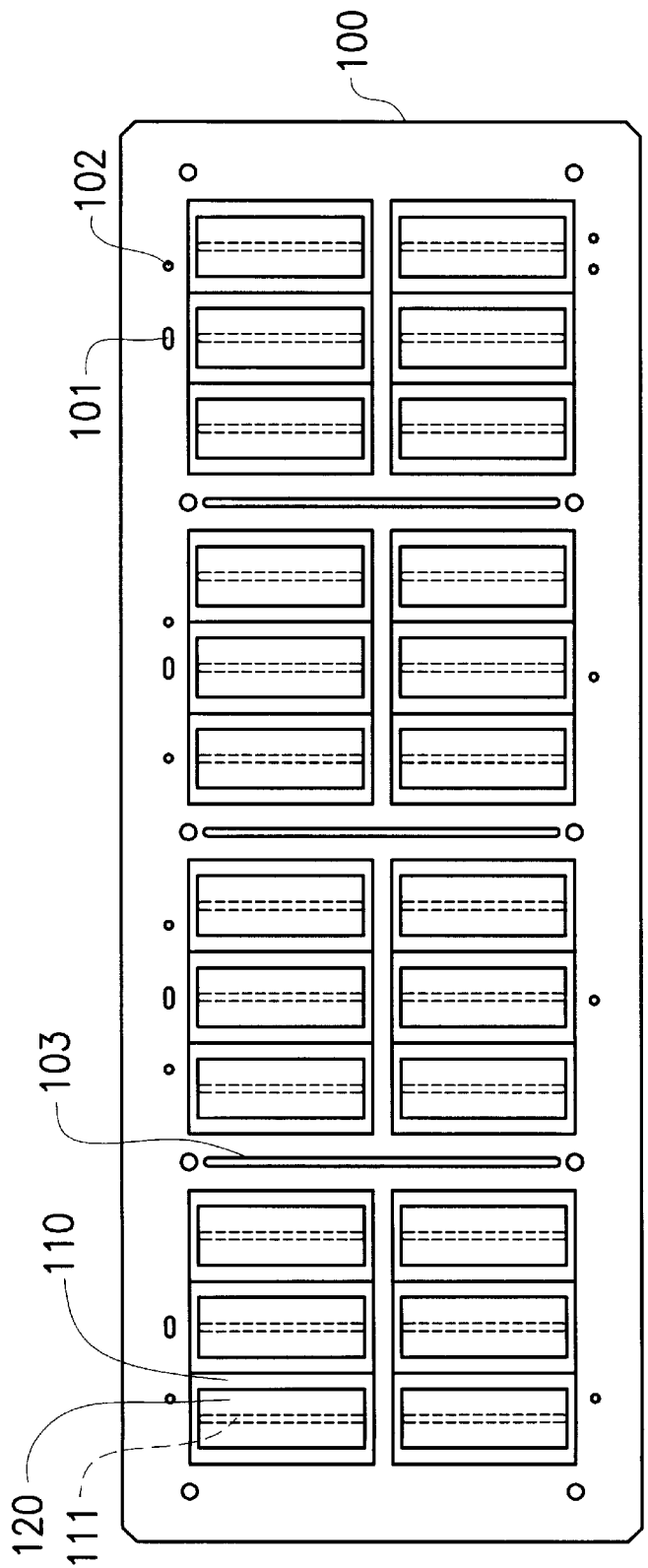
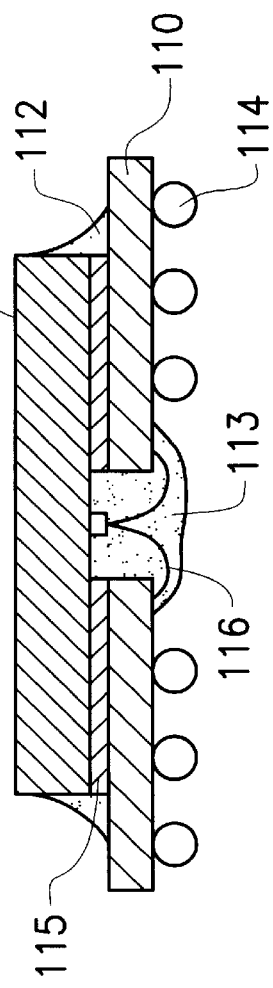
FIG. 1 (PRIOR ART)
FIG. 2 (PRIOR ART)

SUBSTRATE STRUCTURE OF BGA SEMICONDUCTOR PACKAGE

BACKGROUND OF THE INVENTION

1. Field of the Invention

The present invention relates generally to the substrate structure of a BGA semiconductor package, and more particularly to a plurality of dispensing holes which are provided adjacent to the two ends of a hole in the substrate.

2. Description of the Related Art

As the function of the IC ("Integrated Circuit") becomes complicated, the BGA semiconductor package, the package technology of high-finger density, is adapted for use in manufacturing ULSI (Ultra-Large Scale Integration) in sub-micro scale. The BGA semiconductor package is a method of packaging in accordance with the requirement of high finger density.

In the BGA semiconductor package, an adhesive layer of elastomer is attached to the substrate, and then a chip is adhered to the adhesive layer on the substrate. Wires electrically connect the chip and the substrate to form a closed loop. After the wire-bonding process, liquified encapsulant material is dispensed over the wire-bonding area of the chip or around the chip to form an encapsulant. The dispensing process has two steps. In the first step, the liquified encapsulant material is dispensed over the wire bonding-area of the chip to form a first encapsulant on one surface of the substrate, then the substrate is placed in an oven for curing process. The substrate is turned over for the next step of processing. In the second step, the liquified encapsulant material is dispensed around the chip to form a second encapsulant on the other surface of the substrate. Then the substrate is placed in an oven for curing process. A plurality of solder balls is soldered onto the substrate to electrically connect the chip and form the fingers of the chip. At the end, the semiconductor device is cut to form an IC device in the cutting process. The dispensing process and the curing process take a long time, and the processing steps need to be reduced. In addition, during the curing process in the first step, the substrate has warpage under different CTE ("coefficient of thermal expansion") of the substrate and the encapsulant; thus this art has the disadvantage of warpage of the substrate during manufacture.

Referring to FIG. 1, the conventional package has a substrate strip 100 providing a plurality of substrates 110 which have a hole therein. A chip 120 is adhesively attached to the substrate 110 by an adhesive layer (not shown). For carrying and packaging, the substrate has a plurality of guide holes 101, a plurality of position holes 102 and a plurality of separation holes 103.

Referring to FIG. 2, a chip 120 is adhesively attached to the surface of the substrate 110 thereon by an adhesive layer 115. A first encapsulant 112 covers area on the side of chip 120. This area is defined as the upper surface of substrate 100 adjacent to chip 120. The first encapsulant 112 prevents moisture from the environment entering to the package. A second encapsulant 113 covers the area of wires 116 on another surface of substrate 110. Furthermore, a plurality of solder balls 114 is soldered on the same surface as encapsulant 113 to connect to chip 120 and form the fingers of chip 120. However, the liquified encapsulant material of the first encapsulant 112 and the second encapsulant 113 of substrate 110 need to be dispensed onto two surfaces of substrate 110 in two separate steps. This has disadvantage of increasing the complexity of manufacture.

The present invention intends to provide a substrate that has a main hole adjacent to the dispensing holes in such a way as to mitigate and overcome the above problem.

SUMMARY OF THE INVENTION

The primary objective of this invention is to provide a substrate structure of a BGA semiconductor package which includes a substrate that has a main hole whose two ends are adjacent to the dispensing holes on upper surface of the substrate. Thus, an encapsulant is formed on two surfaces of the substrate at the same time by means of liquified encapsulant material that flows through the dispensing hole from the upper surface to the lower surface.

The present invention is the substrate structure of a BGA semiconductor package, and the substrate structure mainly comprises a plurality of substrate units and a plurality of dispensing holes thereon. A main hole is provided on the surface of the substrate unit. The two ends of the main holes are adjacent to the dispensing hole for dispensation of the liquified encapsulant material to form a semiconductor package. The semiconductor package mainly comprises a chip, a substrate and an encapsulant. The chip is adhesively attached to the substrate, and the encapsulant covers the side area of the chip. Then the encapsulant flows from the upper surface of the substrate to the lower surface to cover wire areas by means of the liquified encapsulant material that flows through the dispensing hole from the upper surface of the substrate to the lower surface.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings herein;

FIG. 1 is a top view of a conventional substrate strip;

FIG. 2 is a side view of a conventional BGA semiconductor package;

DETAILED DESCRIPTION OF THE INVENTION

Figure 3:
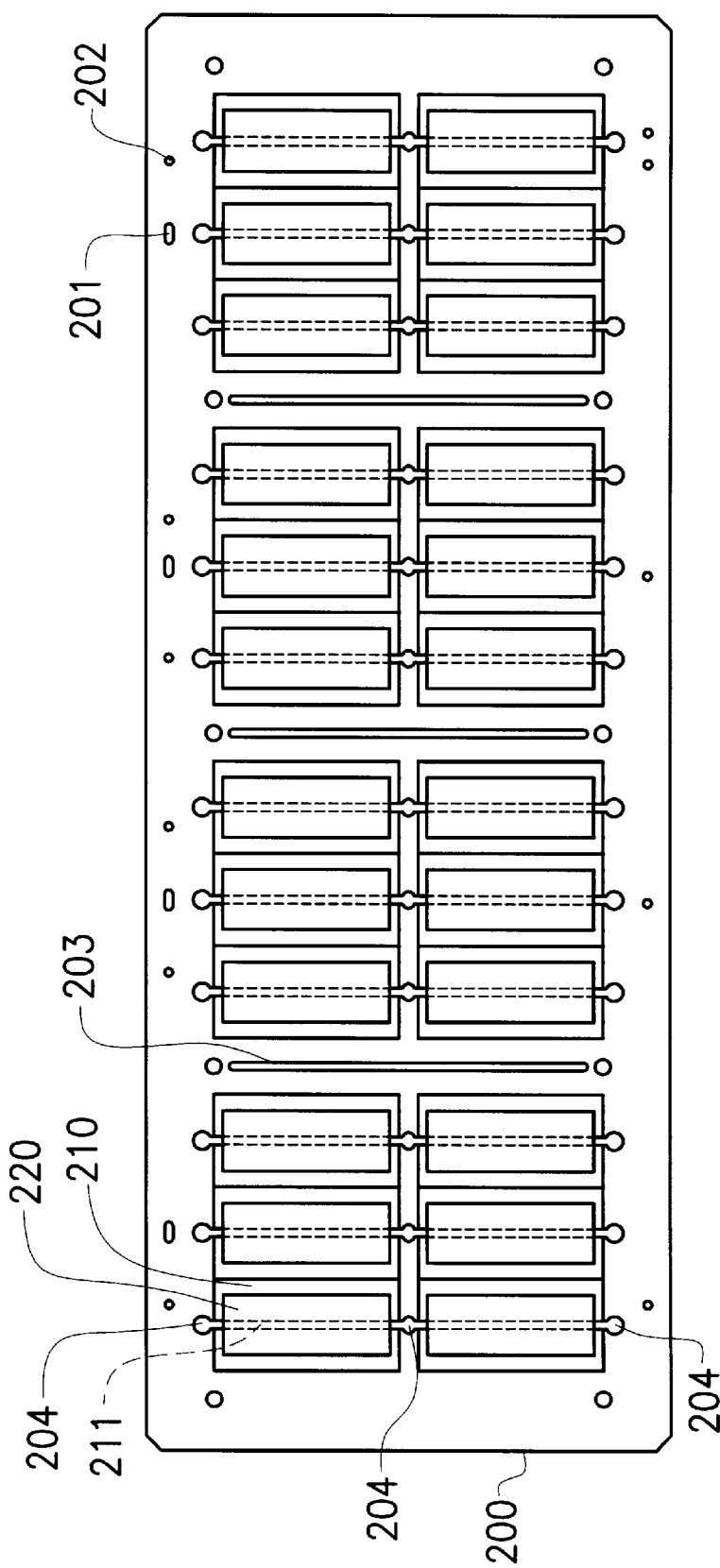
FIG. 3 is a top view of a substrate strip of a BGA semiconductor package in accordance with the present invention.
Figure 4:
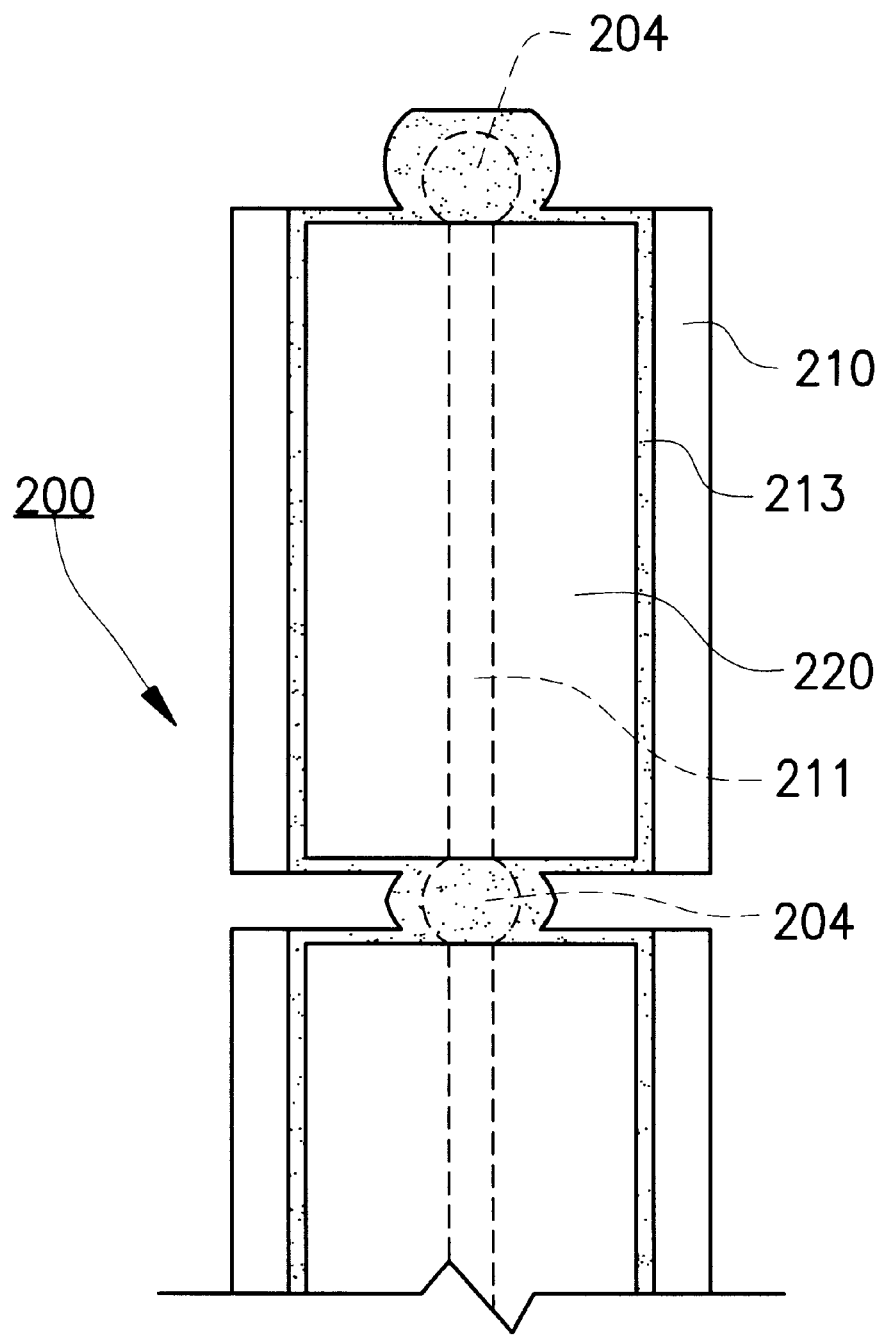
FIG. 4 is an enlarged view of FIG. 3 in accordance with the present invention.
Figure 5:
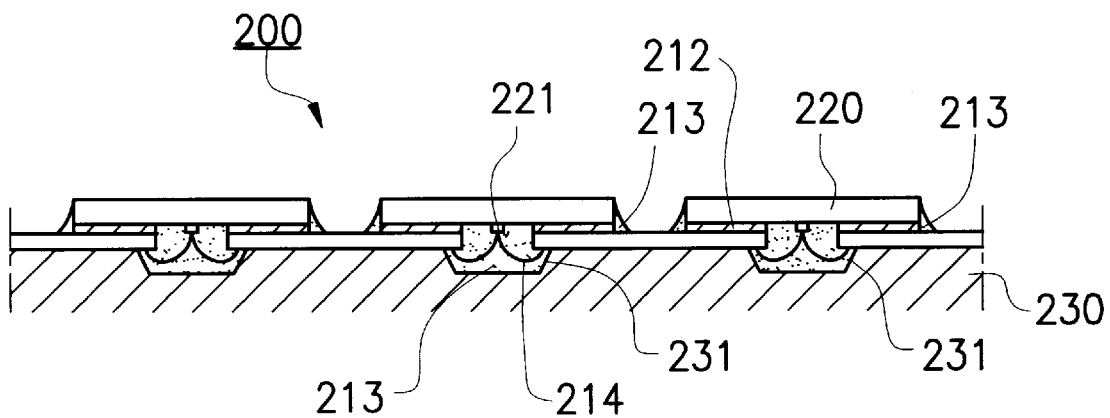
FIG. 5 is a side view of the dispensing process in accordance with the present invention.

Referring to FIGS. 3, 4 and 5, a BGA semiconductor package in accordance with the present invention mainly comprises a substrate strip 200 on which are provided a plurality of guide holes 201, a plurality of position holes 202, a plurality of separation holes 203 and a plurality of dispensing holes 204. The dispensing hole 204 is preferably round or oval shaped. The substrate strip 200 provides a plurality of substrate 210 thereon with a main hole 211, and the two ends of main hole 211 are adjacent to dispensing holes 204. A chip 220 is adhesively attached to main hole 211 of the substrate 210 by an adhesive layer 212. Then a plurality of bonding pads 221 are exposed in the main hole 211. Wires 214 are electrically connect bonding pads 221 and substrate 210 to form a closed loop. Substrate strip 200 is placed on heat block 230 for heating, and main holes 211 of substrate 210 are lined up with channel 231 of heat block 230 for the dispensing process. When chip 220 covers on main hole 211, dispensing hole 204 connects to channel 231 so as to let the liquified encapsulant material flow from the upper surface of the substrate to the lower surface. A dispensing head (not shown) dispenses the liquified encapsulant material around the side of chip 220 to form encapsulant 213. The dispensing head further dispenses the liquified encapsulant material to dispensing hole 204 so that the liquified encapsulant material flows into one end of main hole 211 along channel 231 and emerges from the other end. As shown in FIG. 3, a dispensing hole 204 is formed at each end of each main hole 211. In addition, the dispensing holes 204 connect between every two main holes that align end to end to each other. Then liquified encapsulant material covers the area of wires 214 of chip 220. After the curing process, encapsulant 213 covers the side of chip 220 and wires 214 of chip 220 on two surfaces to form a semiconductor package. In the process of forming an IC device, dispensing holes 204 are cut in substrate strip 200. These dispensing holes 204 are adjacent to the two ends of main holes 211. Substrate 210 is separated into two parts by main hole 211. The two parts of the substrate 210 are mechanically fixed by chip 220 and an encapsulant 213.

Referring to FIGS. 3, 4 and 5, the first chip 210 is adhesively attached to the substrate 200 by a first adhesive layer 211, and first adhesive layer 211 is interposed between the top surface (not labelled) of the substrate 200 and the bottom surface (not labelled) of the first chip 210. A plurality of first bonding pads 212 is provided on first chip 210 for the wire bonding process.

Figure 6:
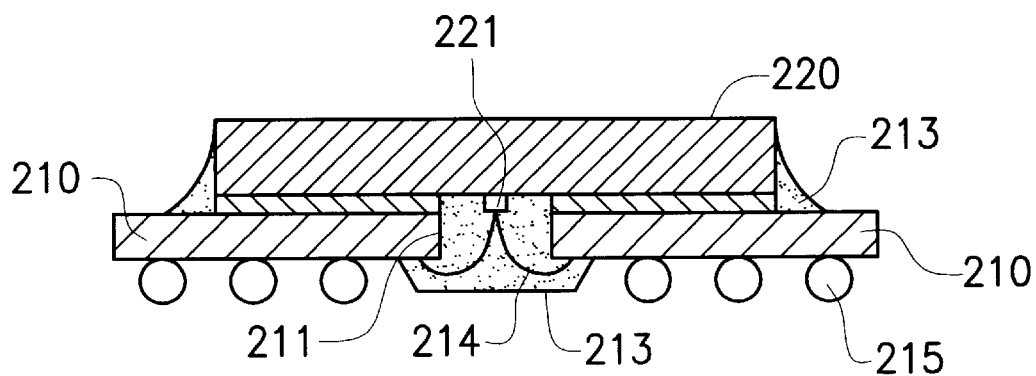
FIG. 6 is a side view of the substrate structure of a BGA semiconductor package in accordance with the present invention.

Referring to FIG. 6, a BGA semiconductor package in accordance with the present invention includes a substrate 210 and a chip 220. The substrate 210 is separated into two parts by groove 211 which is above-mentioned main hole 211 of substrate 210, and is filled to form an adhesive layer (not labeled). The top surface of chip 220 is adhesively attached to groove 211 of substrate 210. This insures that the whole of dispensing hole 204 is not obstructed by chip 220. At least one opening is provided on one end of groove 211 through which opening encapsulant 213 connects an upper encapsulant on one surface of substrate 210 to a lower encapsulant on the other surface. Wires 214 electrically connect bonding pads 221 of chip 210 to and substrate 210 to form a closed loop. Encapsulant 213 extends from the upper surface of substrate 210 to wire area 214 of the lower surface to form a package. The dispensing head dispenses the liquified encapsulant material to form encapsulant 213 in one dispensing process step. Therefore, substrate strip 200 does not need to be turned over for dispensing liquified encapsulant material to the lower surface, and thus involves only one dispensing step thereby reducing time and steps of manufacture. Substrate 210 further has a plurality of solder balls on its lower surface to connect electrically to the chip.

Referring to FIGS. 1 and 3, conventional substrate strip 100, which does not have a dispensing hole, has to be turned over for the next processing step to form a second encapsulant on one surface of the substrate in addition to a first encapsulant on the other surface. The present invention does not require the substrate strip 200 to be turn over for dispensation of liquified encapsulant material to the lower surface because the liquified encapsulant material is dispensed through dispensing holes 204 in one step. Comparing the present invention to the conventional technique, after the dispensing process, substrate strip 200 only needs in one step in the curing process; this reduces the steps of manufacture. Dispensing hole 204 of the present invention is characterized in by being adjacent to the substrate and connecting the upper surface to the lower surface. Although the present invention discloses a preferred embodiment with a centro-pad-designed chip, the present invention can still be used for other designed chip with the appropriate dispensing hole.

Although this invention has been described in detail with reference to its present preferred embodiment, it will be understood by one of ordinary skill in the art that various modifications can be made without departing from the spirit and the scope of the invention, as set forth in the appended claims.

What is claimed is:

1. Substrate strip of BGA semiconductor package, comprising:
   a substrate strip having an upper surface and a lower surface, the substrate strip being divided into a plurality of substrates with a main hole on each substrate connecting the upper surface to the lower surface; and
   a plurality of dispensing holes connecting the upper surface to the lower surface to allow an encapsulant material flowing between the upper surface and the lower surface, wherein every two main holes aligned end to end with each other are connected by the dispensing holes;
   wherein one chip is adhesively attached to one of the substrates without blocking both the dispensing holes at two ends of the main hole.

2. Substrate strip of BGA semiconductor package as defined in claim 1, wherein the main hole's two ends are adjacent to the dispensing holes.

3. Substrate strip of BGA semiconductor package as defined in claim 1, wherein the dispensing hole defines as round-shaped.

4. Substrate strip of BGA semiconductor package as defined in claim 1, wherein the dispensing hole is defined as oval-shaped.

5. Substrate strip of BOA semiconductor package as defined in claim 1, wherein the substrate strip further comprising a plurality of guide hole, a plurality of position holes and a plurality of separation holes.

6. BGA semiconductor package comprising:
   a substrate with a groove that has at least one opening;
   a chip adhesively attaching to the groove of the substrate by an adhesive layer;
   wires electrically connecting the substrate to the chip to form a closed loop; and
   an encapsulant having a first encapsulant which covers the area along one side of the chip and a second encapsulant which covers the wire areas over the chip;
   whereas the first encapsulant flows through the dispensing hole to the second encapsulant.

7. BGA semiconductor package as defined in claim 6, wherein the groove has two ends and forms two openings.

8. BGA semiconductor package as defined in claim 6, wherein the chip is a centro-pad designed chip.

* * * * *